(12) United States Patent
Inagaki

(10) Patent No.: US 6,407,616 B1
(45) Date of Patent: Jun. 18, 2002

(54) TEMPERATURE COMPENSATION CIRCUIT FOR AN ELECTRONIC DEVICE

(75) Inventor: Ryosuke Inagaki, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/577,739

(22) Filed: May 23, 2000

(30) Foreign Application Priority Data

May 25, 1999 (JP) .............................. 11-144298

(51) Int. Cl.[7] .................................................. H01L 35/00
(52) U.S. Cl. ...................................... 327/513; 327/512
(58) Field of Search ................................. 327/307, 317, 327/318, 331, 362, 509, 512, 513; 323/313, 314

(56) References Cited

U.S. PATENT DOCUMENTS

| | | | | |
|---|---|---|---|---|
| 3,701,004 A | * | 10/1972 | Tuccinardi | 323/275 |
| 3,715,609 A | * | 2/1973 | Hallen | 327/513 |
| 4,030,023 A | * | 6/1977 | Keith | 323/313 |
| 4,348,633 A | * | 9/1982 | Davis | 323/314 |
| 4,727,269 A | * | 2/1988 | Luich | 327/51 |
| 4,749,889 A | * | 6/1988 | Lagoni et al. | 327/513 |
| 5,013,999 A | * | 5/1991 | Yamada | 323/313 |
| 5,113,336 A | * | 5/1992 | Takahashi et al. | 363/61 |

* cited by examiner

Primary Examiner—Matthew Smith
Assistant Examiner—Paul Dinh
(74) Attorney, Agent, or Firm—Hogan & Hartson, L.L.P.

(57) ABSTRACT

This temperature compensation circuit comprising: a bipolar transistor having a base for receiving thereon an input voltage; a series third resistor connected between a supply and said bipolar transistor; a first resistor connector between said base of said bipolar transistor and the output end of said temperature compensation circuit; and a second resistor connected between the node of said bipolar transistor and said third resistor and said output end. The combination of the temperature characteristics of the base emitter junction of the bipolar transistor and the first and the second resistors may cancel out an arbitrary temperature characteristic of a given electronic device.

8 Claims, 8 Drawing Sheets

TEMPERATURE COMPENSATION CIRCUIT FOR AN ELECTRONIC DEVICE

FIELD OF THE INVENTION

The invention relates to a simple, inexpensive electronic circuit for providing temperature compensation to an electronic device such as a semiconductor integrated circuit (ICE).

BACKGROUND OF THE INVENTION

A common practice to implement an electronic system having desired characteristics is to assemble various discrete components including semiconductors and the like each having a specific functionality required for the electronic device. However, it is often the case that assembling such components fails to provide the very desired functionality under certain conditions.

For example, some of the components poses a problem that they lose their anticipated characteristics at a lower and/or higher temperature than room temperature if they have desired characteristics at room temperature. Conventionally, when such problem arises, a different semiconductor circuit must be sought for or the function block associated with the semiconductor must be modified to circumvent problem. In cases where a solution for such problem is not found, a compromise is made to limit the use range of the electronic device. It is obvious, however, that these measures are not true solutions to the problem.

As an example, take a conventional voltage controlled oscillator VCO as shown in FIG. 10(a). In FIG. 10(a), the voltage controlled oscillator VCO has an external terminal for connection with an external resistor R, and an input terminal IN which is supplied with a variable voltage indicative of signal S (said voltage hereinafter referred to as signal voltage S) from a variable voltage source. The oscillator is intended to generate an output of frequency f at its output terminal OUT. The output frequency f is presumably proportional to the signal voltage S as shown in FIG. 10(b), so that the signal voltage S is chosen to provide a required frequency f.

In actuality, however, the frequency f of the voltage controlled oscillator VCO varies with temperature, if the signal voltage S is kept constant. This is because not only the external resistor R but also various components of the voltage controlled oscillator VCO have temperature characteristics which cause the frequency f to change with ambient temperature as shown by a broken curve or a dotted curve in FIG. 10(c) as opposed to the ideal behavior of an oscillator having no temperature dependence as indicated by a solid curve in FIG. 10(c).

FIG. 11(a) shows a circuit diagram of a data lock voltage controlled oscillator VCO that follows the data of a digital video cassette recorder (DVC). It is shown that the voltage controlled oscillator VCO is provided at a control terminal C thereof with a control voltage which determines the free running or natural oscillation frequency of the oscillator VCO. The control voltage for the free running oscillation is obtained by dividing the voltage difference between the supply voltage VCC and the voltage of a power supply B by the resistors (1.8 kilo-Ohms and 15 kilo-Ohms in the example shown herein). A desired frequency f of 41.85 MHz, for example, may be obtained by adjusting the voltage of the power supply B. A signal voltage S is supplied to the input terminal IN. The oscillator VCO will generate at the output terminal OUT thereof an oscillatory signal whose frequency varies in response to the signal voltage S input to an input terminal IN of the electronic device and about the frequency (41.85 MHz) determined by the control voltage input to the control terminal C.

This exemplary volume controlled oscillator VCO employs a general purpose compact integrated circuit and has generally acceptable system characteristics under certain design conditions. However, it has a poor temperature characteristic in that the oscillation frequency tends to appreciably decreases as the ambient temperature increases, as shown in FIG. 11(b).

A conventional solution to eliminate such temperature dependence of the oscillator system includes use of a high-quality external resistor R having less temperature dependence or a special resistor which has a counter-temperature dependence to cancel out even the temperature characteristic of the oscillator VCO.

However, use of such a costly external resistor or seeking for a different semiconductor circuit, or even limiting the usable range of the oscillator VCO is by no means a favorable solution to the problem from the points of cost, manufacturing efficiency, and usability of the VCO.

SUMMARY OF THE INVENTION

It is therefore an object of the invention to provide a temperature compensation circuit utilizing ordinary electronic elements which enables an electronic device such as a voltage controlled oscillator (VCO) to maintain its required temperature characteristic.

In accordance with one aspect of the invention, the temperature compensation circuit for an electronic device comprises:

at least one semiconductor element having a PN junction adapted to receive on the P-layer thereof an input voltage;

an output circuit for regulating the voltage impressed across said PN junction (PN junction voltage) and adding said regulated PN junction voltage to said input voltage, thereby generating a control voltage for said electronic device canceling out the temperature characteristic of said electronic device.

This output circuit generates a control voltage which changes with ambient temperature to oppose the thermal change in the output of the electronic device caused by the ambient temperature change.

The output circuit may have a sufficient number of semiconductor elements, each having a PN junction, for generating a control voltage to cancel out said temperature characteristic of said electronic device.

This is based on the fact that the counteractive temperature effect of the semiconductor elements depends on the number of the elements.

The output circuit may have a first and a second resistors connected in series with each other and in parallel with said PN junction(s) such that said control voltage is available at the node of said first and second resistor.

In this arrangement, said first and second resistors may have resistances such that said control voltage cancel out the temperature characteristic of said electronic device.

In cases where one of the two resistors is chosen to have an infinitely large resistance, a necessary control voltage may be obtained to cancel out the temperature characteristic of the electronic device by simply adjusting the resistance of the other resistor.

In accordance with another aspect of the invention, the temperature compensation circuit comprises:

a bipolar transistor having a base for receiving thereon an input voltage;

a series third resistor connected between a power supply and said bipolar transistor;

a first resistor connected between said base of said bipolar transistor and the output end of said temperature compensation circuit; and a second resistor connected between the node of said bipolar transistor and said third resistor and said output end.

It should be appreciated that this temperature compensation circuit has a simple structure that the temperature characteristic of the base emitter junction of the bipolar transistor is coupled with the temperature characteristics of the first and the second resistors. Nevertheless, the compensation circuit may provide a control voltage for desired temperature compensation to an electronic device such as a voltage controlled oscillator (VCO) or an electronic device utilizing such oscillator.

In this arrangement, one of the first and the second resistors may have an infinitely large resistance, in which case a preferable control voltage to cancel out the characteristic thermal change of the electronic device may be obtained by simply adjusting the resistance of the other resistor.

In accordance with a further aspect of the invention, the temperature compensation circuit comprises:

a bipolar transistor having a base for receiving thereon an input voltage (hereinafter referred to as input bipolar transistor);

at least one diode or diode-connected bipolar transistor connected in series with said input bipolar transistor;

a third resistor connected in series with said input bipolar transistor and said at least one diode or diode-connected bipolar transistor, said series connected between a power supply and a grounding line;

a first resistor connected between said base of said input bipolar transistor and an output end of said temperature compensation circuit; and a second resistor connected between the node of said diode or diode-connected bipolar transistor and said output end.

In this simple arrangement, varied temperature compensation may be obtained for an arbitrary voltage controlled device, subject to an ambient temperature change, by combining the temperature characteristics of the first and the second resisters with the temperature characteristic of the multiplicity of series diode-connected bipolar transistors. The series bipolar transistors are equivalent to a diode having a large base-emitter voltage across the base-emitter junction. In fact, the temperature compensation circuit can substantially cancel out an over all temperature characteristic of a semiconductor IC device such as voltage controlled oscillator or of an electronic device utilizing a voltage controlled oscillator.

In this example also, one of the first and the second resistors may have an infinite resistance while the other may have zero resistance, and a preferable control voltage may be obtained to cancel out the temperature characteristic of the electronic device by simply adjusting the number of the series diodes or diode connected bipolar transistors.

BRIEF DESCRIPTION OF THE DRAWINGS

The foregoing and other objects features and advantages of the present invention will be apparent from the following detailed description of the preferred embodiments of the invention reference being made to the accompanying drawings in which like reference numerals indicate like parts and in which.

DETAILED DESCRIPTION OF THE PREFERRED EMBODIMENT

Figure 1:
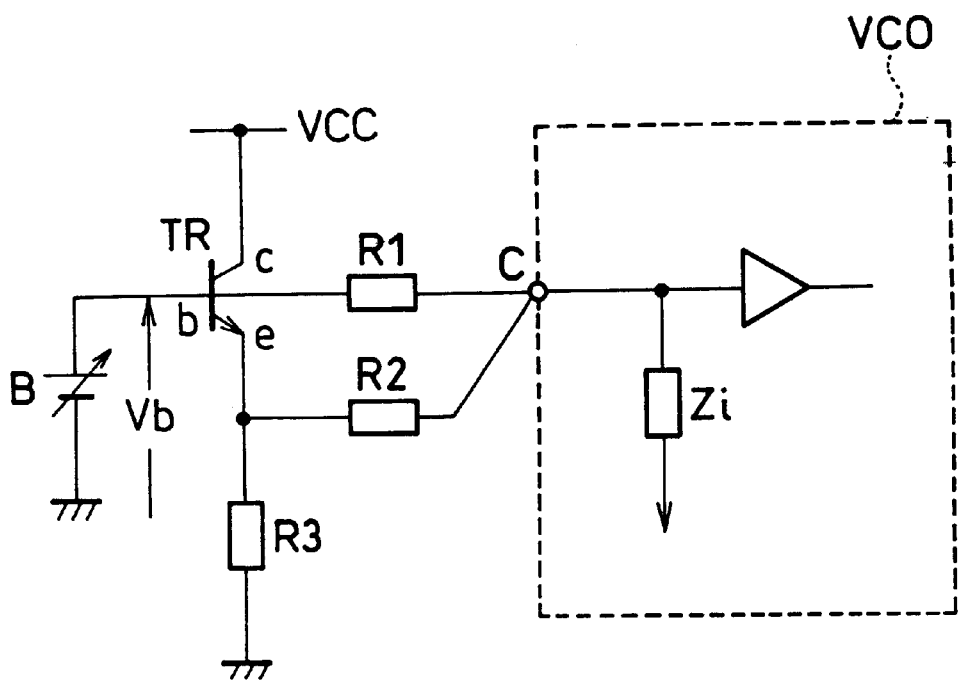
FIG. 1 shows a first temperature compensation circuit of the invention for use with an electronic device.

Referring now to FIG. 1, there is shown a first temperature compensation circuit according to the invention. FIG. 1 also shows a voltage controlled oscillator VCO whose temperature characteristic is corrected by the temperature compensation circuit. The voltage controlled oscillator VCO has an input impedance Zi, and is supplied at the control terminal C thereof with a temperature compensated control voltage.

The temperature compensation circuit may be constructed using a semiconductor element having a PN junction such as a transistor, diode, and a thyrsistor. The example shown herein uses a bipolar transistor TR.

In the example shown herein, a NPN type bipolar transistor TR and a third resistor R3 are connected in series in between a power supply VCC and a grounding line. Connected between the base b of the bipolar transistor TR and the control terminal C of the voltage controlled oscillator VCO is a first resistor R1. Connected between the emitter e of the bipolar transistor TR and the control terminal C of the voltage controlled oscillator VCO is a second resistor R2. The base b of the bipolar transistor TR is further connected to a variable dc current source B, whose voltage is adjusted to a preferable control voltage Vb for the voltage controlled oscillator VCO.

In the temperature compensation circuit thus configured, the control terminal C is supplied with a control voltage Vb via two different paths: one through the first resistor R1 and another through the emitter e of the transistor TR and the second resistor R2.

The base-emitter voltage across the base b and the emitter of the transistor TR amounts to the forward voltage of a 'diode', which has, in the example shown herein, negative temperature coefficient of about −2 mV/° C. On the other hand, the voltage supplied to the control terminal C of the voltage controlled oscillator VCO through the second path is the sum of the base-emitter voltage Vbe of the transistor TR and the voltage across the second resistor R2. These voltages depend on the respective temperature characteristics of the base-emitter junction and the resistor R2. The sum is fed to the oscillator, allowing for the impedance Zi.

Thus, if the voltage input to the control terminal C of the oscillator VCO is VIN; the impedance Zi of the oscillator VCO, infinite; and the voltage input to the base of the transistor TR, Vb, then the control voltage is given by $$VIN = Vb - k \cdot Vbe$$

where $$0 \leq k = R1/(R1+R2) \leq 1.$$

It is seen that the control voltage VIN has a negative temperature coefficient, −k, and that the value of k, R1/(R1+R2), is constant at all temperature provided that the resistances R1 and R2 are constant. The control voltage VIN may be changed in the range from Vb to (Vb−Vbe) by varying the resistances R1 and R2. In this manner, it is possible to generate a control voltage VIN which cancels out temperature characteristic of the oscillator VCO by adequately setting up the resistances R1 and R2. Similarly, in the case where the input impedance is finite, the apparent temperature characteristic of the voltage controlled oscillator VCO can be made approximately constant by supplying the oscillator VCO with the temperature compensating control voltage VIN.

The temperature compensation circuit shown herein is suitable to not only a single semiconductor IC device but also a sophisticated system which involves different components and/or multiple circuits.

It is noted that the transistor TR and the resistors R1–R3 are available on the market, so that the temperature compensation circuit of the invention can be manufactured at a minimum cost, without using any special elements.

It is also noted that the temperature compensation circuit may be formed either as a built-in component into an IC device or an independent discrete circuit for use with an IC device.

Although the base-emitter voltage Vbe and the temperature coefficient of the base-emitter junction of a transistor TR can vary from one oscillator to another, they are approximately constant (approximately 0.6 V and −2 mV/° C., respectively), so that such variations can be absorbed in the compensation made by the temperature compensation circuit. In fact, given the temperature characteristic of a voltage controlled oscillator VCO, the temperature compensation circuit may be adequately adjusted to provide required compensation to the oscillator VCO. This can be done by rendering the first through the third resistors variable and by appropriately choosing the resistances of these resistors.

Figure 2:
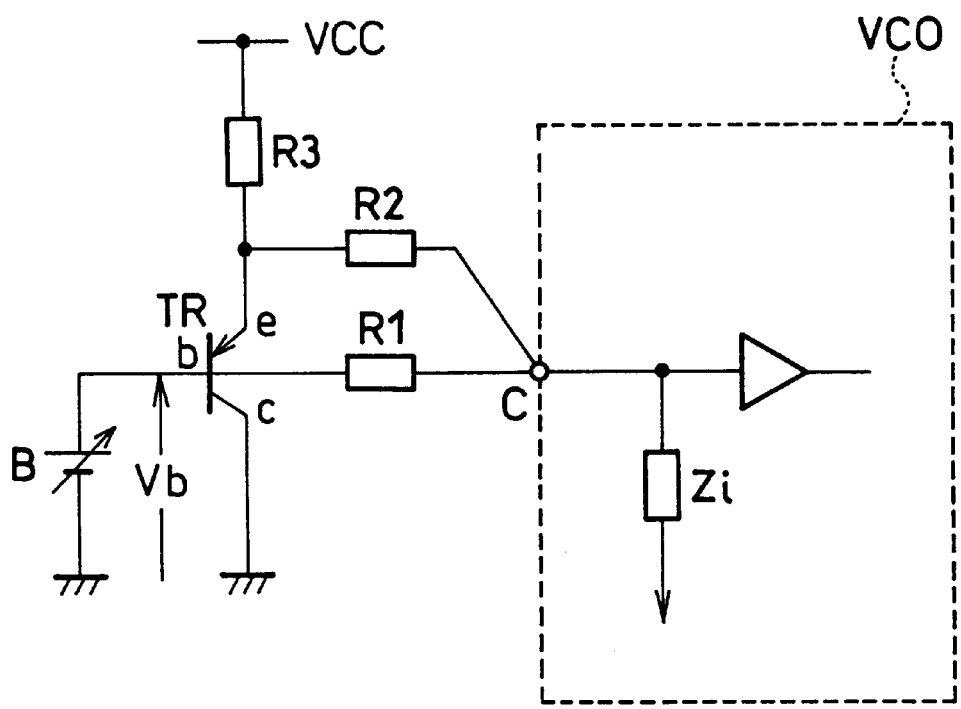
FIG. 2 shows a second temperature compensation circuit of the invention for use with an electronic device.

FIG. 2 is a block diagram of a second temperature compensation circuit for use with an electronic device according to the invention. The temperature compensation circuit shown in FIG. 2 is basically the same as the first example shown in FIG. 1. The second example, however, differs from the first one in that the bipolar transistor TR is a PNP type transistor. Hence, the arrangement of the circuit is partly reversed as opposed to the first example.

The second example has a similar temperature compensation functionality as the first example, but works in the opposite way as compared to the NPN type transistor owing to the PNP type transistor.

The control voltage VIN is then given by $$VIN = Vb + k \cdot Veb$$

where $$0 \leq k = R1/(R1 + R2) \leq 1.$$

Thus, the control voltage VIN input to the voltage controlled oscillator VCO may be varied in the range from Vb to (Vb+Veb). It is noted that the magnitude of the temperature coefficient of the transistor TR of the second example is the same as the first one and that the temperature compensation circuit gives a positive temperature compensation to the voltage controlled oscillator VCO in contrast to the negative temperature compensation given by the first one.

Therefore, a PNP bipolar transistor TR as shown in FIG. 2 when coupled with an NPN bipolar transistor TR as shown in FIG. 1 may provide a varied temperature compensation.

Figure 3:
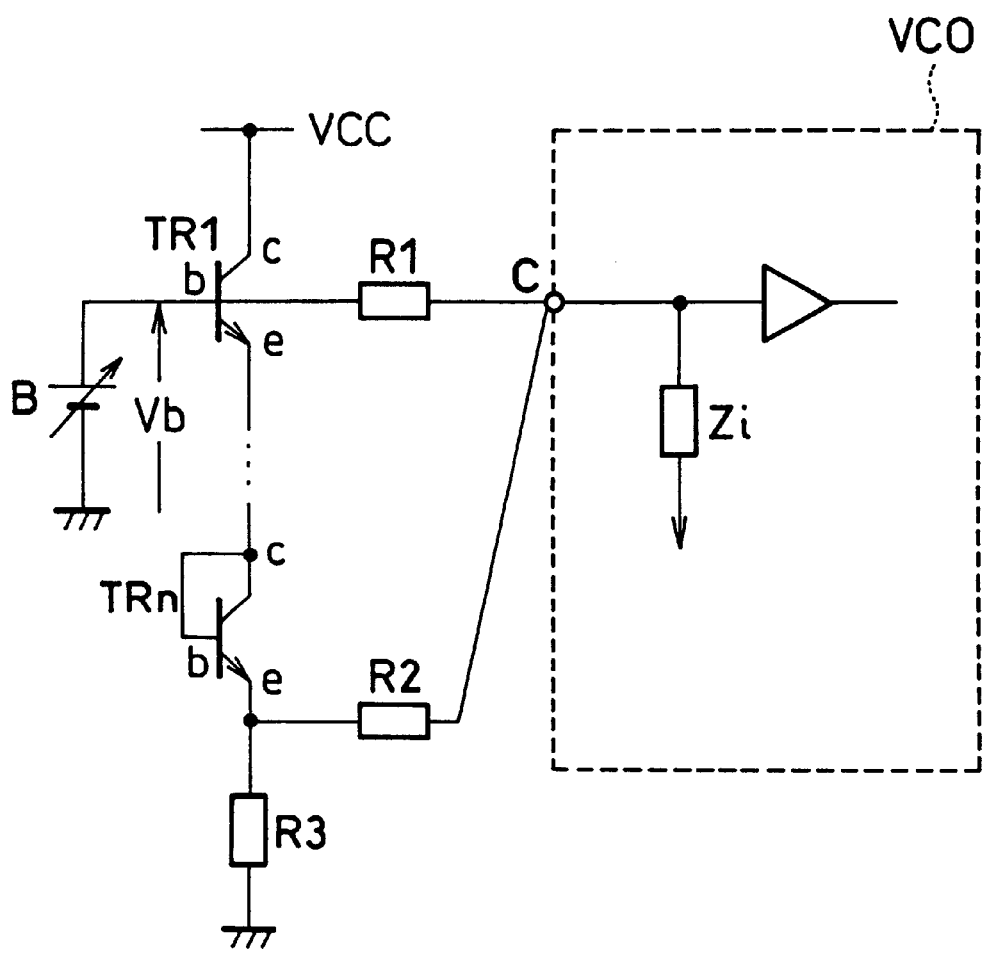
FIG. 3 shows a third temperature compensation circuit of the invention for use with an electronic device.

FIG. 3 is a block diagram of a third temperature compensation circuit of the invention for an electronic device. Again the temperature compensation circuit shown in FIG. 3 is basically the same as the first example shown in FIG. 1. However, the former differs from the latter in that the former has a number n ($n \geq 1$) of NPN bipolar transistor(s) TR2–TRn connected in series with the first bipolar transistor (i.e. input bipolar transistor) TR1 having a base b to which a control voltage Vb is fed, such that the series NPN bipolar transistor(s) TR2–TRn are diode-connected, that is, the bases of the transistor(s) TR2–TRn are connected with their respective collectors. The third resistor R3 is connected between the series NPN bipolar transistor(s) TR2–TRn and a grounding line. The second resistor R2 is connected between the control terminal C of the voltage controlled oscillator VCO and the node of the third resistor R3 and the series NPN bipolar transistors TR2–TRn.

The temperature compensation circuit shown in FIG. 3 may provide the same temperature compensation as the one shown in FIG. 1. In addition, because of the n diode-connected bipolar transistor(s) connected with the input bipolar transistor, this compensation circuit may provide further temperature compensation of about 0.6n (V) between the input voltage Vb and the second resistor R2 with a negative temperature coefficient of about −2n (mV/° C.).

Figure 4:
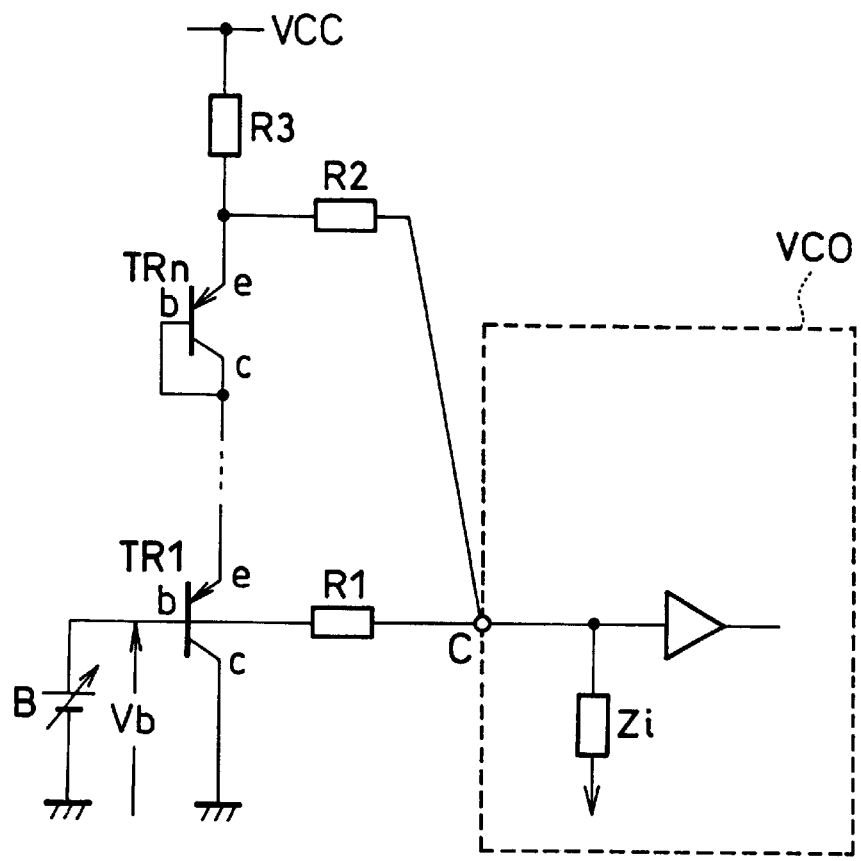
FIG. 4 shows a fourth temperature compensation circuit of the invention for use with an electronic device.

FIG. 4 is a schematic diagram of the fourth temperature compensation circuit according to the invention, which may provide the same temperature compensation as the second example shown in FIG. 2. This example only differs from the second one in that a number n ($n \geq 1$) of PNP bipolar transistor(s) TR2–TRn connected in series with the first bipolar transistor (input bipolar transistor) TR1 having a base b to which a control voltage Vb is fed, such that the series PNP bipolar transistor(s) TR2–TRn are diode-connected, that is, the bases of the transistor(s) TR2–TRn are connected with their respective collectors. The third resistor R3 is connected between the series PNP bipolar transistor(s) TR2–TRn and a grounding line. The second resistor R2 is connected between the control terminal C of the voltage controlled oscillator VCO and the node of the third resistor R3 and the series PNP bipolar transistors TR2–TRn.

The temperature compensation circuit shown in FIG. 4 may provide the same temperature compensation as the second one shown in FIG. 2. In addition, because of the n diode-connected bipolar transistors connected with the input bipolar transistor, this compensation circuit may provide further temperature compensation of about 0.6n (V) between the input voltage Vb and the second resistor R2 with a negative temperature coefficient of about −2n (mV/° C.), which is much greater as compared with the first and the second ones.

It would be understood that the temperature coefficient of the fourth example is opposite in sign as compared with the third example shown in FIG. 3, due to the fact that series transistors TR1–TRn are PNP type transistors. Thus, n NPN bipolar transistor(s) TR1–TRn as shown in FIG. 3 when coupled with PNP bipolar transistor(s) TR1–TRn as shown in FIG. 4 may provide much varied temperature compensation.

It would be understood that the bipolar transistors TR2–TRn used in the third and the fourth examples may be replaced by diodes, since these bipolar transistors are functioning as diodes.

FIGS. 5–8 show modifications of the examples shown in FIGS. 1–4. It is noted that the first and the second resistors R1 and R2, respectively, in any of FIGS. 1–4 can be variable resistors so that desired temperature compensation is provided to a given electronic device such as a voltage controlled oscillator VCO by adjusting the resistances of these resistors. Further, one or both of the resistors R1 and R2 may be omitted if the influence of them on the temperature compensation is negligible within a required precision of the temperature compensation to the electronic device.

Figure 5:
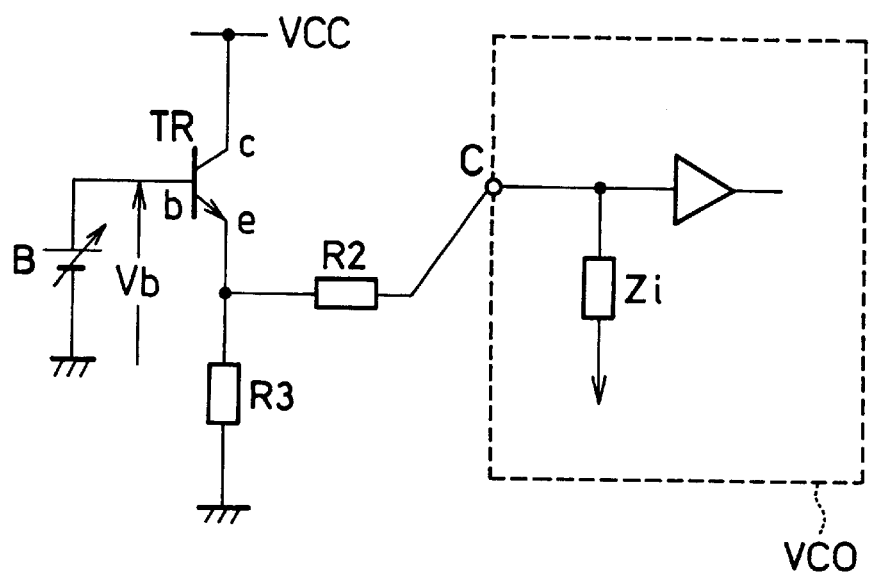
FIG. 5 shows a modification of the first temperature compensation circuit of the invention.
Figure 6:
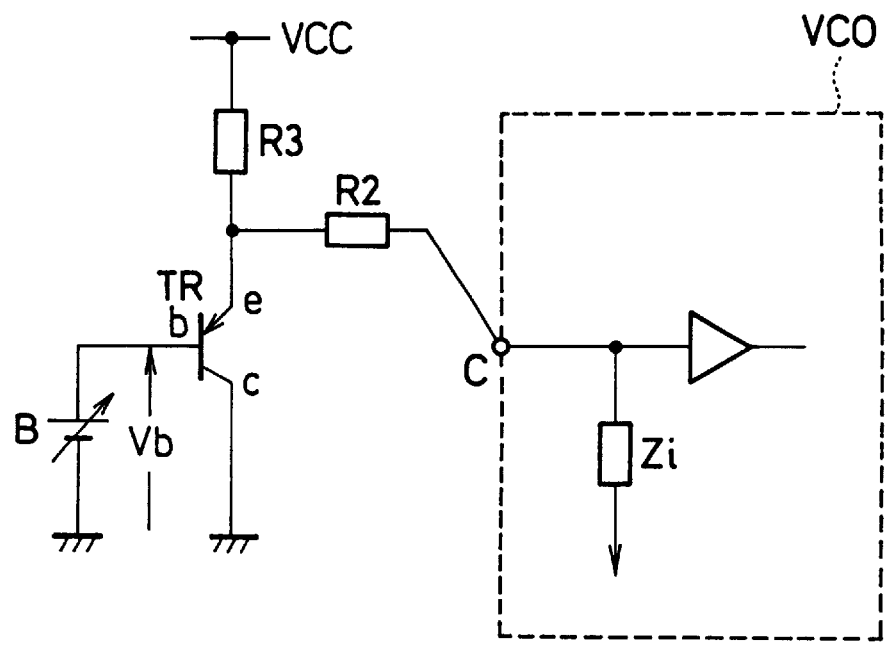
FIG. 6 shows a modification of the second temperature compensation circuit of the invention.
Figure 7:
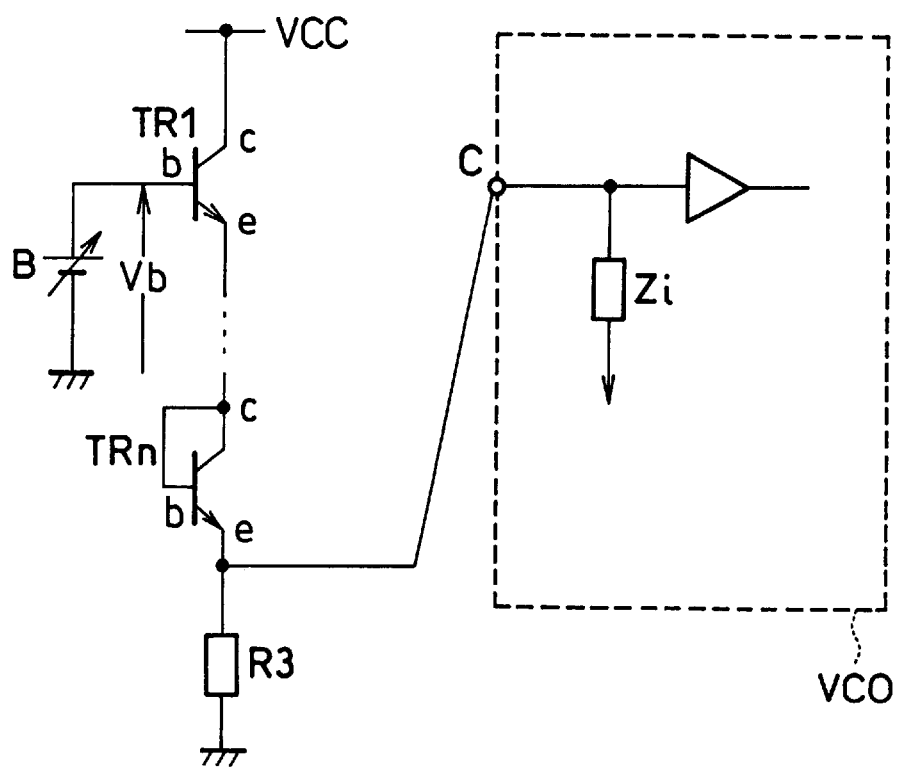
FIG. 7 shows a modification of the third temperature compensation circuit of the invention.
Figure 8:
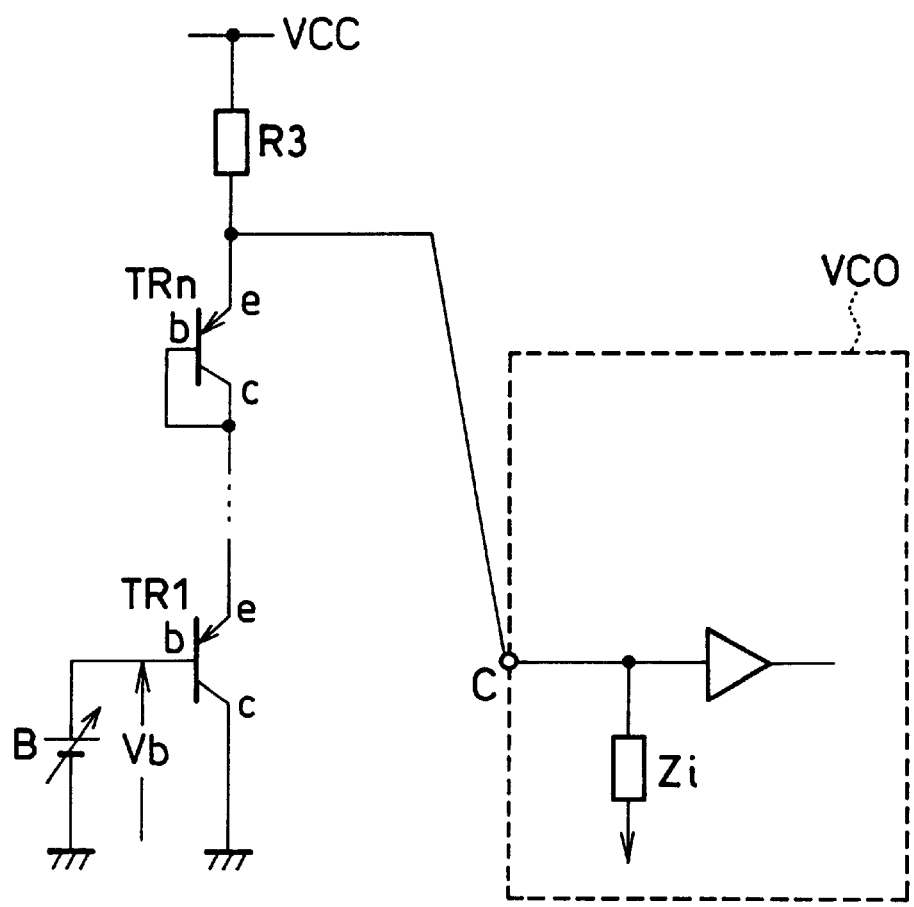
FIG. 8 shows a modification of the fourth temperature compensation circuit of the invention.

For example, the first resistor R1 as shown in FIGS. 1 and 2 may have an infinitely large resistance. In that event, it may be removed in the circuit diagram, as shown in FIGS. 5 and 6. In the examples shown in FIGS. 7 and 8, the first resistance R1 of FIGS. 3 and 4, respectively, has an infinitely large resistance while the second resistor R2 has zero resistance, so that they are omitted from the circuit diagrams.

Figure 9A:
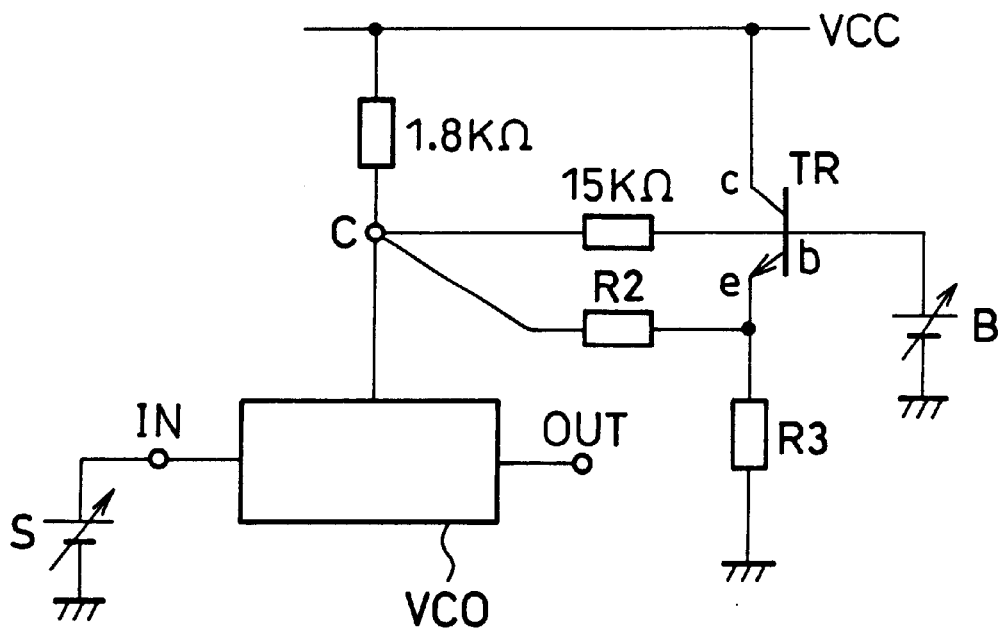
FIG. 9 is an exemplary electronic device to which a temperature compensation circuit of the invention is applied.
Figure 9B:
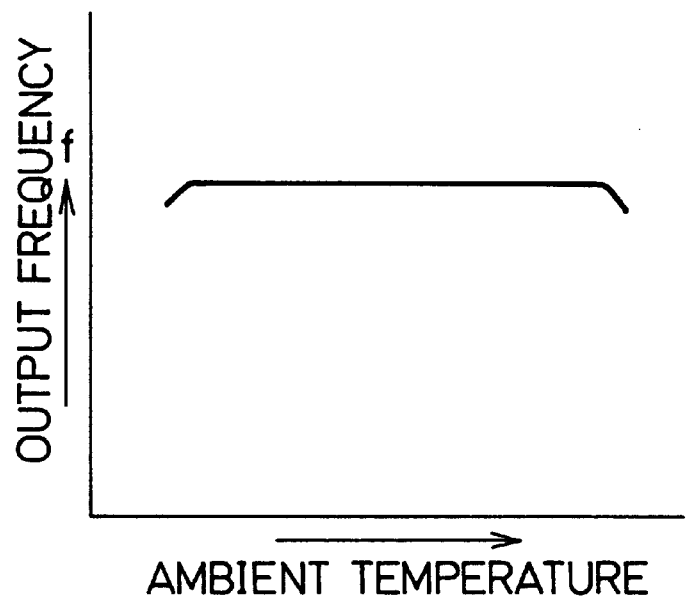
Figure 10:
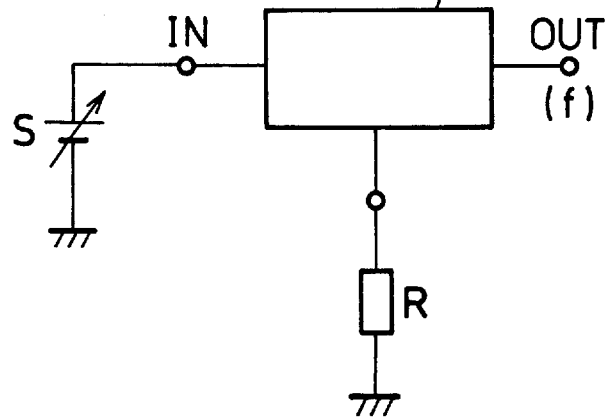
FIG. 10 shows a conventional voltage controlled oscillator.
Figure 10:
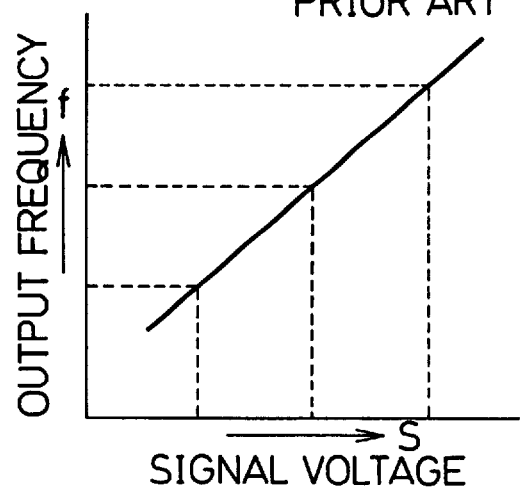
Figure 10:
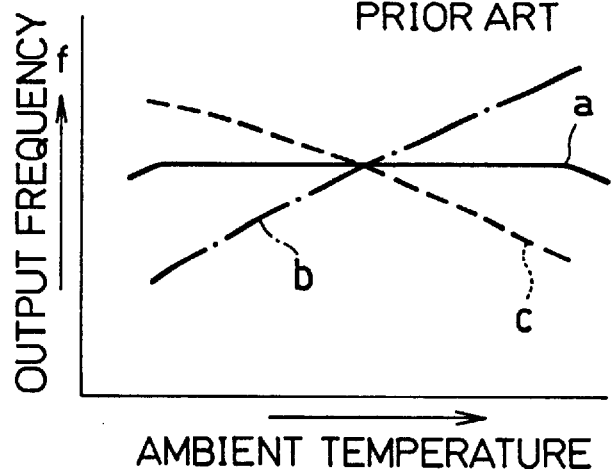

FIG. 9(a) show an example of a temperature compensation circuit of the invention applied to a data-locking voltage controlled oscillator VCO which follows data fed to a digital video cassette recorder (DVC). FIG. 9(b) is a graphical representation of the temperature characteristic of the data-locking voltage controlled oscillator VCO.

The voltage controlled oscillator VCO is supplied at the control terminal C thereof with a control voltage for determining the free running oscillation frequency. The control voltage is given by the voltage VCC of a power supply B minus the base-emitter voltage of an NPN bipolar transistor TR, divided by the 1.8 kilo-Ohms resistor and the resistor R2. The level of the source voltage VCC is adjusted so that the oscillator VCO provides a prescribed oscillation frequency of 41.85 MHz, for example, under a signal voltage S fed to the input terminal IN of the oscillator VCO.

The oscillation frequency generated at the output terminal OUT of the oscillator will vary with the voltage of the signal fed to the control terminal C about the preset frequency (41.85 MHz).

Figure 11:
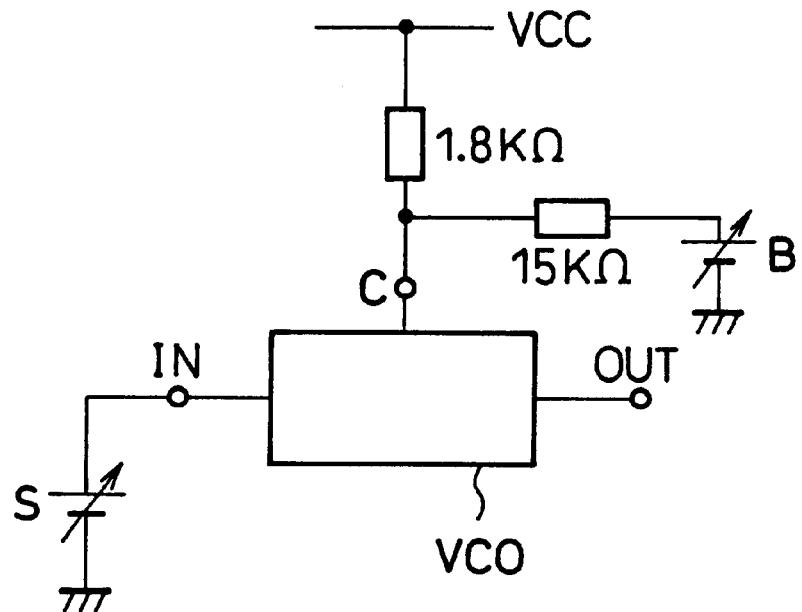
FIG. 11 shows another conventional voltage controlled oscillator.
Figure 11:
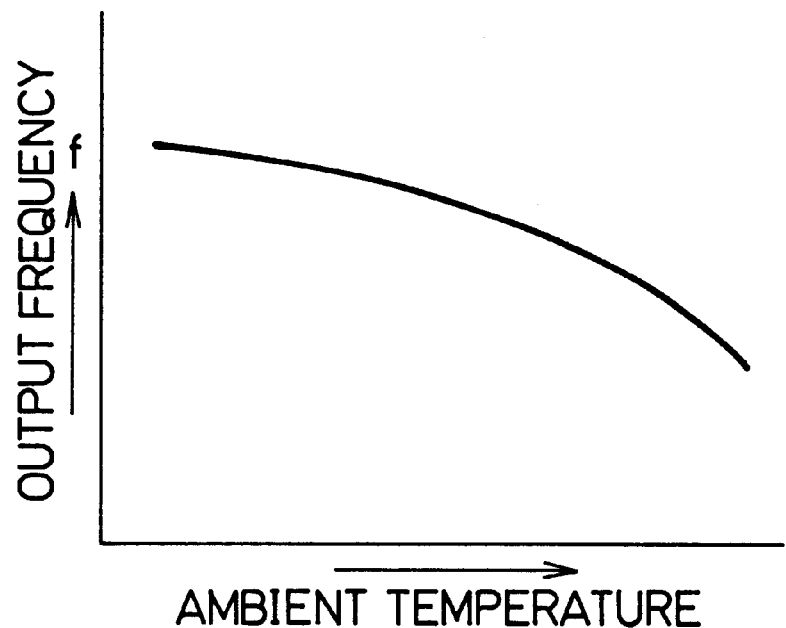

With this temperature compensation circuit as shown in FIG. 9(a), the temperature coefficient of the voltage controlled oscillator VCO is canceled out by appropriately regulating the resistance of the resistor R2 and choosing an adequate control voltage V for the oscillator VCO, as opposed to a case where the voltage controlled oscillator is not provided with the temperature compensation circuit which has a temperature characteristic as shown in FIG. 11(b).

I claim:

1. A temperature compensation circuit for providing temperature compensation for an electronic device having a temperature characteristic, comprising:

at least one semiconductor element having a PN junction adapted to receive on the P-layer thereof an input voltage;

an output circuit for regulating the voltage for the PN junction and adding said regulated voltage to said input voltage, thereby generating a control voltage for said electronic device counteracting a temperature dependence of said electronic device, wherein said output circuit has first and second resistors connected in series across said PN junction to generate said control voltage at a node between said first and second resistor.

2. The temperature compensation circuit as claimed in claim 1, wherein said first and second resistors have resistances such that a temperature characteristic of said control voltage cancels the temperature characteristic of said electronic device.

3. The temperature compensation circuit as claimed in claim 1, wherein one of said first or second resistors forms an open circuit.

4. An electronic device comprising the temperature compensation circuit as claimed in claim 1 and a voltage controlled oscillator (VCO), wherein the output of said temperature compensation is coupled to the VCO as an input.

5. A temperature compensation circuit for providing temperature compensation for an electronic device having a temperature characteristic, comprising:

a bipolar transistor having a base for receiving thereon an input voltage;

a third resistor connected in series with said bipolar transistor between a power supply and ground;

a first resistor connected between said base of said bipolar transistor and an output end of said temperature compensation circuit; and a second resistor connected between the output end and a node between said bipolar transistor and said third resistor.

6. The temperature compensation circuit as claimed in claim 5, wherein one of said first and second resistors forms an open circuit.

7. A temperature compensation circuit for providing temperature compensation for an electronic device having a temperature characteristic, comprising:

an input bipolar transistor having a base for receiving thereon an input voltage;

at least one diode or diode-connected bipolar transistor connected in series with said input bipolar transistor;

a third resistor connected in series with said input bipolar transistor and said at least one diode or diode-connected bipolar transistor between a power supply and a grounding line;

a first resistor connected between said base of said input bipolar transistor and an output end of said temperature compensation circuit; and a second resistor connected between the output end and a node between said diode or diode-connected bipolar transistor and the third resistor.

8. The temperature compensation circuit as claimed in claim 7, wherein said first resistor forms an open circuit, while said second resistor has zero resistance.

* * * * *